(12) United States Patent
Chew et al.

(10) Patent No.: US 8,796,844 B2
(45) Date of Patent: Aug. 5, 2014

(54) PACKAGE STRUCTURE

(75) Inventors: Hwee-Seng Jimmy Chew, Singapore (SG); Chee Kian Ong, Singapore (SG)

(73) Assignee: AdvanPack Solutions Pte Ltd., Singapore (SG)

( * ) Notice: Subject to any disclaimer, the term of this patent is extended or adjusted under 35 U.S.C. 154(b) by 62 days.

(21) Appl. No.: 13/393,746

(22) PCT Filed: Sep. 2, 2009

(86) PCT No.: PCT/IB2009/006710
§ 371 (c)(1), (2), (4) Date: Mar. 1, 2012

(87) PCT Pub. No.: WO2011/027186
PCT Pub. Date: Mar. 10, 2011

(65) Prior Publication Data
US 2012/0153466 A1    Jun. 21, 2012

(51) Int. Cl.
*H01L 23/02* (2006.01)
*H01L 23/34* (2006.01)
*H05K 1/02* (2006.01)
*H01L 25/065* (2006.01)
*H01L 23/538* (2006.01)

(52) U.S. Cl.
CPC .. *H01L 25/0655* (2013.01); *H05K 2201/10522* (2013.01); *H01L 2224/73204* (2013.01); *H05K 2201/10674* (2013.01); *H01L 2924/09701* (2013.01); *H05K 1/0243* (2013.01); *H05K 2201/10378* (2013.01); *H01L 2924/15311* (2013.01); *H01L 2224/16227* (2013.01); *H01L 23/5386* (2013.01)
USPC ........... 257/723; 257/685; 257/777; 257/778; 257/E23.169; 257/E25.005; 257/E25.01; 257/E25.011; 257/E25.012; 257/E25.015; 257/E25.016; 257/E25.023; 257/E25.026

(58) Field of Classification Search
USPC ............ 257/686, E25.005, E25.01, E25.011, 257/E25.012, E25.015, E25.016, E25.023, 257/E25.026
See application file for complete search history.

(56) References Cited

U.S. PATENT DOCUMENTS 5,386,341 A    1/1995  Olson et al.
6,034,438 A    3/2000  Petersen
(Continued)

FOREIGN PATENT DOCUMENTS

EP    0682369    11/1995

OTHER PUBLICATIONS

PCT/ISA/237 Written Opinion issued on PCT/IB2009//006710 (pp. 6), 2005.
(Continued)

*Primary Examiner* — Jasmine Clark
(74) *Attorney, Agent, or Firm* — The Farrell Law Firm, P.C.

(57) ABSTRACT

A package structure including a first semiconductor element, a second semiconductor element, a semiconductor interposer and a substrate is provided. The first semiconductor element includes multiple first conductive bumps. The second semiconductor element includes multiple second conductive bumps. The semiconductor interposer includes a connection motherboard, at least one signal wire and at least one signal conductive column. The signal wire is disposed on the connection motherboard. The two ends of the signal wire are electrically connected to one of the first conductive bumps and one of the second conductive bumps respectively. The signal conductive column is electrically connected to the signal wire. The substrate is electrically connected to the signal conductive column. The first and the second semiconductor elements have the same circuit structure. The substrate of the package structure can simultaneously form a signal communication path with the first and the second semiconductor element respectively.

30 Claims, 6 Drawing Sheets

(56) References Cited

U.S. PATENT DOCUMENTS

| | | |
|---|---|---|
| 6,372,540 B1 * | 4/2002 | Huemoeller ............ 438/106 |
| 6,426,550 B2 | 7/2002 | Ball et al. |
| 7,060,601 B2 * | 6/2006 | Savastiouk et al. ........ 438/584 |
| 7,745,915 B2 * | 6/2010 | Suwa et al. ............ 257/678 |
| 7,898,087 B2 * | 3/2011 | Chainer ............... 257/775 |
| 2006/0192282 A1 | 8/2006 | Suwa et al. |

OTHER PUBLICATIONS

PCT/ISA/210 Search Report issued on PCT/IB2009/006710 (pp. 5), 2005.

* cited by examiner

PACKAGE STRUCTURE

PRIORITY

This application is the 35 U.S.C. §371 national stage of PCT application PCT/IB2009/006710, filed Sep. 2, 2009, the disclosure of which is hereby incorporated by reference.

BACKGROUND OF THE INVENTION

1. Field of the Invention

The invention relates in general to a package structure, and more particularly to a package structure having semiconductor interposer.

2. Description of the Related Art

The invention of semiconductor element marks a milestone in the development of science and technology. The packaging technology plays an essential role in the semiconductor technology. Along with the advance in the semiconductor element, the elements become more versatile and the packaging technology also becomes more complicated.

Generally speaking, the semiconductor elements are electrically connected to and disposed on a substrate, and are then covered by a sealant to form a package structure. Then, external signals are transmitted to the internal of the semiconductor element through the substrate.

To be pursuant to the design of "lightweight, thinness, and compactness", more than two semiconductor elements are disposed on the same substrate, and share the same substrate. Then, the semiconductor elements and the substrate are packaged to form a package structure, so that the volume of the product is reduced.

However, each semiconductor element has many points of electrical connection, and it is a great challenge to the circuit design trying to connect the points of electrical connection of more than two semiconductor elements to the substrate.

Under the circumstances that the design of the points of electrical connection of the semiconductor elements is getting more and more complicated, how to reduce difference in arrival time and improve the transmission efficiency of the power signal for the points of electrical connection of a semiconductor element or more than two semiconductor elements has become an imminent issue to be resolved.

SUMMARY OF THE INVENTION

The invention is directed to a package structure. Through the design of the wire of a semiconductor interposer, the substrate of the package structure can simultaneously form a signal communication path with the first semiconductor element and with the second semiconductor element respectively.

According to a first aspect of the present invention, a package structure is provided. The package structure includes at least one first semiconductor element, at least one second semiconductor element, a semiconductor interposer, and a substrate. The first semiconductor element includes a plurality of first conductive bumps. The second semiconductor element includes a plurality of second conductive bumps. The semiconductor interposer includes a connection motherboard, at least one signal wire and at least one signal conductive column. The signal wire is disposed on the connection motherboard. The two ends of the signal wire are electrically connected to one of the first conductive bumps and one of the second conductive bumps respectively. The signal conductive column is electrically connected to the signal wire. The substrate is electrically connected to signal conductive columns. The first semiconductor element and the second semiconductor element both are a memory chip. The first semiconductor element and the second semiconductor element have the same circuit structure.

According to a second aspect of the present invention, a package structure is provided. The package structure includes a semiconductor element, a semiconductor interposer and a substrate. The semiconductor element includes at least two signal conductive bumps. The semiconductor interposer includes a connection motherboard, at least two signal conductive columns and at least two signal wires. The signal conductive columns pass through the connection motherboard. The signal wires are disposed on the connection motherboard. The two ends of each signal wire are electrically connected to one of the signal conductive bumps and one of the signal conductive columns respectively. The lengths of each signal wires are substantially the same. The substrate is electrically connected to the signal conductive columns.

The invention will become apparent from the following detailed description of the preferred but non-limiting embodiments. The following description is made with reference to the accompanying drawings.

DETAILED DESCRIPTION OF THE INVENTION

First Embodiment

Figure 1:
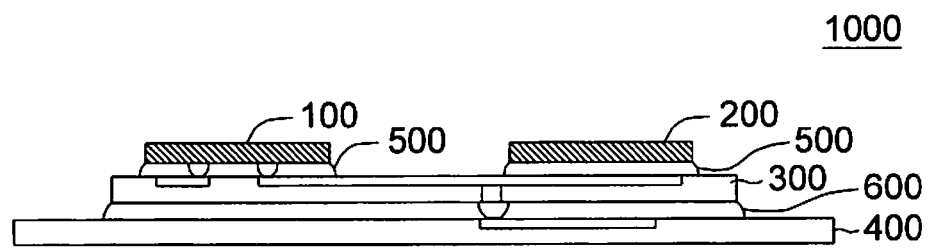
FIG. 1 shows a package structure according to a first embodiment of the invention.

Referring to FIG. 1, a package structure 1000 according to a first embodiment of the invention is shown. The package structure 1000 of the present embodiment of the invention includes a first semiconductor element 100, a second semiconductor element 200, a semiconductor interposer 300 and a substrate 400, wherein examples of the material of the semiconductor interposer 300 include thermo plastic and epoxy. Examples of the first semiconductor element 100 and the second semiconductor element 200 include memory chip, processing chip and photo-sensitive chip. In the present embodiment of the invention, the first semiconductor element 100 and the second semiconductor element 200 both are a memory chip and have the same circuit structure. The substrate 400 is made from an insulation material, such as glass fiber (FR4) or ceramic material. The semiconductor interposer 300 is disposed between the first semiconductor 100 and the substrate 400, and also between the second semiconductor 200 and the substrate 400. The semiconductor interposer 300 enables the substrate 400 to be electrically connected to the first semiconductor element 100 and the second semiconductor element 200 at the same time. To further elaborate the detailed elements of the package structure 1000 of the present embodiment of the invention, a top view and a number of cross-sectional views along different cross-sectional lines are disclosed below.

Figure 2:
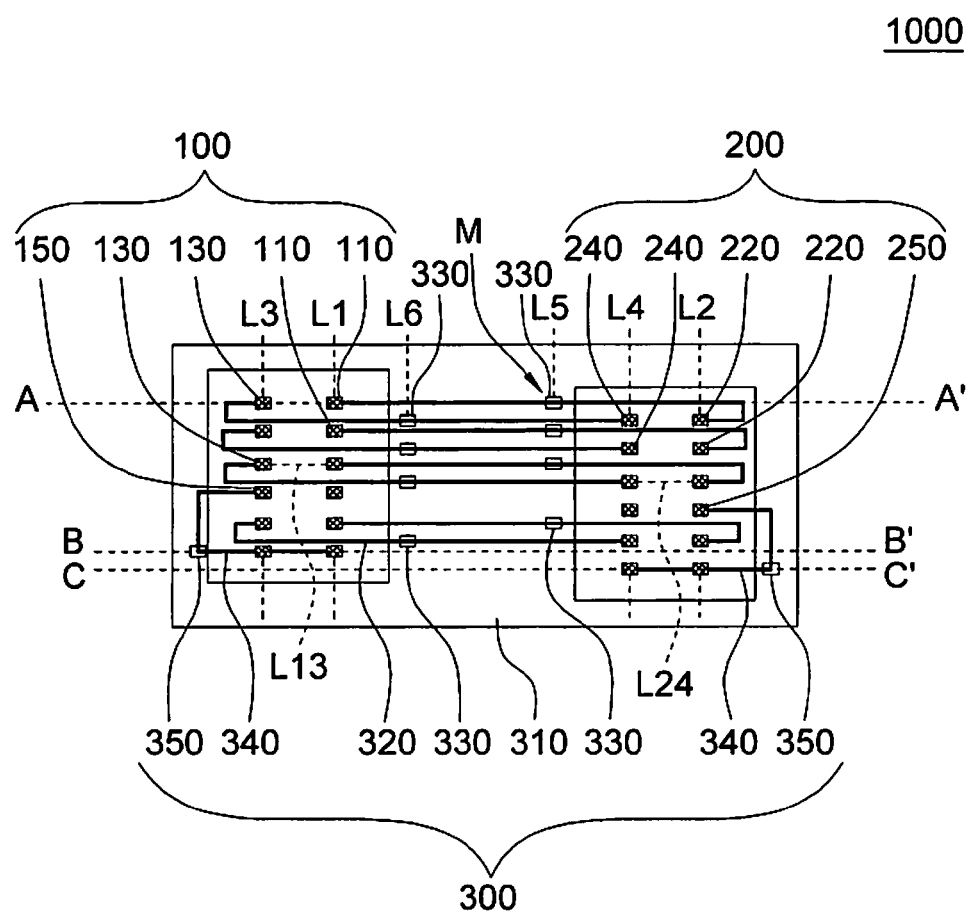
FIG. 2 shows a top view of the package structure of FIG. 1.
Figure 3A:
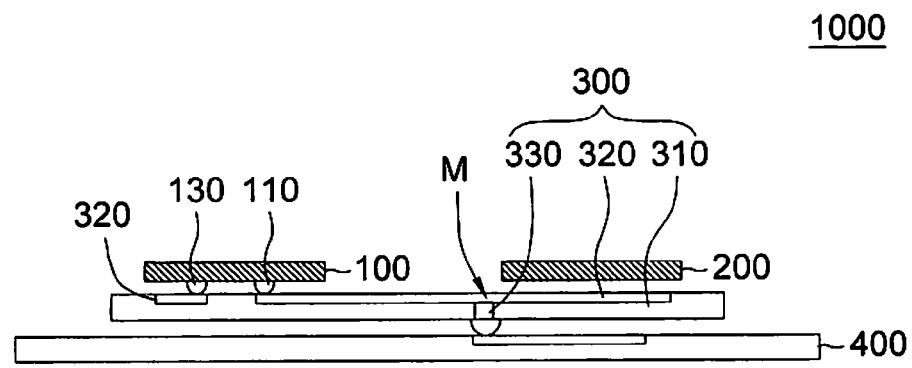
FIG. 3A shows a cross-sectional view along a cross-sectional line A-A' of the package structure of FIG. 2.
Figure 3B:
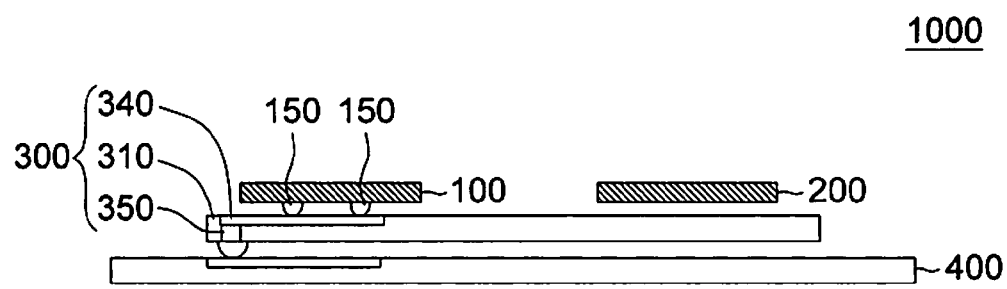
FIG. 3B shows a cross-sectional view along a cross-sectional line B-B' of the package structure of FIG. 2.
Figure 3C:
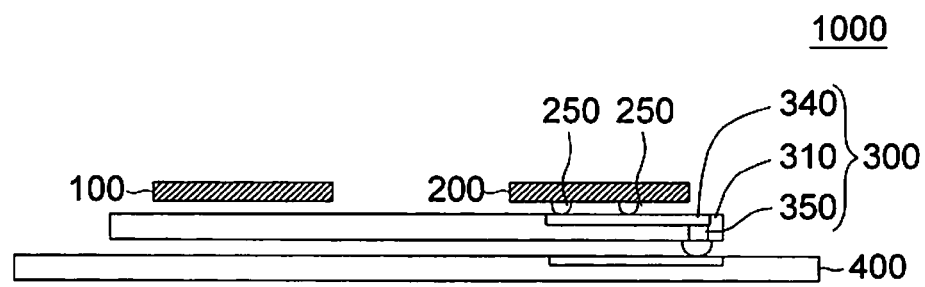
FIG. 3C shows a cross-sectional view along a cross-sectional line C-C' of the package structure of FIG. 2.

Referring to FIG. 2 and FIGS. 3A-3C. FIG. 2 shows a top view of the package structure 1000 of FIG. 1. FIG. 3A shows a cross-sectional view along a cross-sectional line A-A' of the package structure 1000 of FIG. 2. FIG. 3B shows a cross-sectional view along a cross-sectional line B-B' of the package structure 1000 of FIG. 2. FIG. 3C shows a cross-sectional view along a cross-sectional line C-C' of the package structure 1000 of FIG. 2. As indicated in FIG. 2, the first semiconductor element 100 includes a plurality of first conductive bumps 110, a plurality of third conductive bumps 130 and a plurality of power conductive bumps 150. The second semiconductor element 200 includes a plurality of second conductive bumps 220, a plurality of fourth conductive bumps 240 and a plurality of power conductive bumps 250.

To further elaborate the detailed elements of the package structure 1000, the internal elements of the package structure 1000 are illustrated in FIG. 2. The first conductive bumps 110 are arranged along a first extension line LI, the second conductive bumps 220 are arranged along a second extension line L2, the third conductive bumps 130 are arranged along a third extension line L3, and the fourth conductive bumps 240 are arranged along a fourth extension line L4. The first extension line LI, the second extension line L2, the third extension line L3 and the fourth extension line L4 substantially are parallel to each other.

Moreover, the interval between the first extension line LI and the third extension line L3 substantially is 350 µm. The interval between the first conductive bumps 110 substantially is 150 µm, and the interval between the third conductive bumps 130 substantially is 150 µm.

The first conductive bumps 110 and the third conductive bumps 130 are opposite to each other. That is, the connection line L13 connecting the first conductive bump 110 and the corresponding third conductive bump 130 is substantially perpendicular to the first extension line LI and the third extension line L3. Likewise, the second conductive bumps 220 and the fourth conductive bumps 240 are opposite to each other. That is, the connection line L24 connecting the second conductive bump 220 and the corresponding fourth conductive bump 240 is substantially perpendicular to the second extension line L2 and the fourth extension line L4.

Let FIG. 3A be taken for example. The first conductive bump 110 and the third conductive bump 130 can be both seen when being viewed along the cross-sectional line A-A' of FIG. 2.

In the present embodiment of the invention, the first semiconductor element 100 and the second semiconductor element 200 substantially have similar structure, so the disposition of the first conductive bump 110 and the third conductive bump 130 is similar to that of the second conductive bump 220 and the fourth conductive bump 240.

That is, the interval between the second extension line L2 and the fourth extension line L4 substantially is 350 µm, the interval between second conductive bumps 220 substantially is 150 µm, and the interval between fourth conductive bumps 240 substantially is 150 µm.

As indicated in FIG. 2, the semiconductor interposer 300 of the present embodiment of the invention includes a connection motherboard 310, a plurality of signal wires 320, a plurality of power wires 340, a plurality of signal conductive columns 330 and a plurality of power conductive columns 350. The signal wires 320 are disposed on the connection motherboard 310. The two ends of a part of the signal wires 320 are electrically connected to one of the first conductive bumps 110 and one of the second conductive bumps 220 respectively, and the two ends of the other part of the signal wires 320 are electrically connected to one of the third conductive bumps 130 and one of the fourth conductive bumps 240 respectively.

Figure 4:
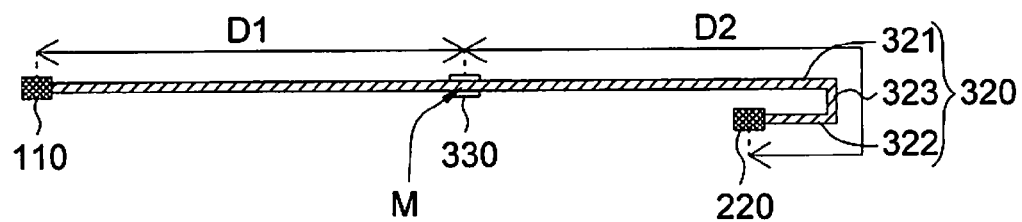
FIG. 4 shows a first conductive bump, a signal wire, a signal conductive column and a second conductive bump of FIG. 2.

Referring to FIG. 2, FIG. 3A and FIG. 4. FIG. 4 shows the first conductive bump 110, the signal wire 320, the signal conductive column 330 and the second conductive bump 220 of FIG. 2. As indicated in FIG. 3A, the signal conductive columns 330 pass through the connection motherboard 310. The substrate 400 is electrically connected to the signal wire 320 through the signal conductive columns 330. Moreover, the first conductive bump 110, the signal wire 320 and the signal conductive column 330 form a signal transmission path.

Likewise, the second conductive bump 220, the signal wire 320 and the signal conductive column 330 form another signal transmission path. That is, the signals of the first conductive bump 110 and the second conductive bump 220 together can be transmitted to the substrate 400. In other words, the substrate 400 can transmit signal to the first conductive bump 110 and the second conductive bump 220 via the same signal conductive column 330.

As indicated in FIG. 4, the signal conductive column 330 is electrically connected to a middle point M of the signal wire 320. The distances DI and D2 from the middle point M to the two ends of the signal wire 320 are substantially the same, therefore the lengths of the two signal transmission path are also the same, and difference in arrival time between the paths of signal transmission is reduced.

As indicated in FIG. 2, in the first semiconductor element 100, there are some third conductive bumps 130 disposed at the left of the first conductive bump 110, but no other conductive bump is disposed at the right of the first conductive bump 110. In the second semiconductor element 200, there are some fourth conductive bumps 240 disposed at the left of the second conductive bump 220, but no other conductive bump is disposed at the right of the second conductive bump 220. For the first conductive bump 110 to be electrically connected to the second conductive bump 220 smoothly and for the third conductive bump 130 to be electrically connected to the fourth conductive bump 240 smoothly, the first conductive bumps 110 and the second conductive bumps 220 are interlaced.

To put it in greater details, the signal wire 320, which is extended from the first conductive bump 110, is firstly extended rightward, then downward, and at last leftward to the second conductive bump 220 to form a U-shaped bending structure whose opening faces the left. The signal wire 320, which is extended from the fourth conductive bump 240, is firstly extended leftward, then upward, and at last rightward to form a U-shaped bending structure whose opening faces the right.

For the convenience of elaboration, FIG. 2 is used for elaborating the "upward, downward, leftward, and rightward". However, the elaboration of "upward, downward, leftward, rightward" is not for limiting the invention, and anyone who is skilled in the technology of the invention will understand that when FIG. 2 is rotated to an angle, the elaboration of "upward, downward, leftward, rightward" will be adjusted accordingly.

The U-shaped bending structure disclosed above prolongs the distances between the middle point M of the signal wire 320 and the two ends of the signal wire 320. A part of the signal conductive columns 330 are arranged along a fifth extension line L5, a part of signal conductive columns 330 are arranged along a sixth extension line L6, and the interval between the fifth extension line L5 and the sixth extension line L6 is larger than the interval between the first extension line L1 and the third extension line L3 as well as the interval between the second extension line L2 and the fourth extension line L4.

Referring to FIG. 4. The signal wire 320 of the present embodiment of the invention includes a first sub-signal wire 321, a second sub-signal wire 322 and a third sub-signal wires 323. One end of the first sub-signal wires 321 is connected to one of the first conductive bump 110. One end of the second sub-signal wire 322 is connected to one of the second conductive bump 220 and is parallel to the first sub-signal wires 321. The two ends of the third sub-signal wires 323 are connected to the other end of the first sub-signal wires 321 and the other end of the second sub-signal wires 322 respectively.

In the present embodiment of the invention, the third sub-signal wire 323 is substantially perpendicular to the first sub-signal wires 321 and the second sub-signal wires 322. That is, the signal wire 320 of the present embodiment of the invention has a U-shaped bending structure with double right angles. Likewise, the signal wire 320 connecting the third conductive bump 130 and the fourth conductive bump 240 also has a similar structure and is not repeated here.

As disclosed above, the semiconductor interposer 300 of the present embodiment of the invention enables the first semiconductor element 100 and the second semiconductor element 200 to form its respective signal transmission path with the substrate 400 by using a single-layered circuit structure only without using a complicated multi-layered circuit structure, hence largely reducing the manufacturing cost and the material cost.

In terms of the power transmission path, the power wire 340 is serially connected to and disposed near the power conductive bumps 150 of the first semiconductor element 100 as indicated in FIG. 2. As indicated in FIG. 3B, the power conductive bump 150, the power wire 340 and the power conductive column 350 together form a power transmission path. Likewise, as indicated in FIG. 3C, the power conductive bump 250, the power wire 340 and the power conductive column 350 also form a power transmission path.

Generally speaking, if the power signal has a large volume of current, then the impedance of the wire is as lower as possible to avoid the wire might being overheated. Let the power conductive bumps 150 be taken for example. As the power conductive bumps 150 is serially connected to one power wire 340, the quantity of the power wire 340 can be decreased. The power wire 340 is disposed near the power conductive bumps 150, so the length of the power wire 340 can also be reduced. Thus, the impedance of the power wire 340 is reduced to a minimum, and the transmission efficiency of the power signal is enhanced.

Referring to FIG. 1, the package structure 1000 of the present embodiment of the invention further includes a first sealant 500 and a second sealant 600. The first sealant 500 is disposed between the first semiconductor element 100 and the semiconductor interposer 300 and also between the second semiconductor element 200 and the semiconductor interposer 300. The second sealant 600 is disposed between semiconductor interposer 300 and the substrate 400.

The first conductive bump 110, the second conductive bump 220, the third conductive bump 130 (not illustrated in FIG. 1), the fourth conductive bump 240 (not illustrated in FIG. 1), the signal wire 320 and the power wire 340 all are encapsulated inside the first sealant 500. The signal conductive column 330 and the power conductive column 350 are encapsulated inside the second sealant 600. Thus, the package structure 1000 is thoroughly protected.

Second Embodiment

Figure 5:
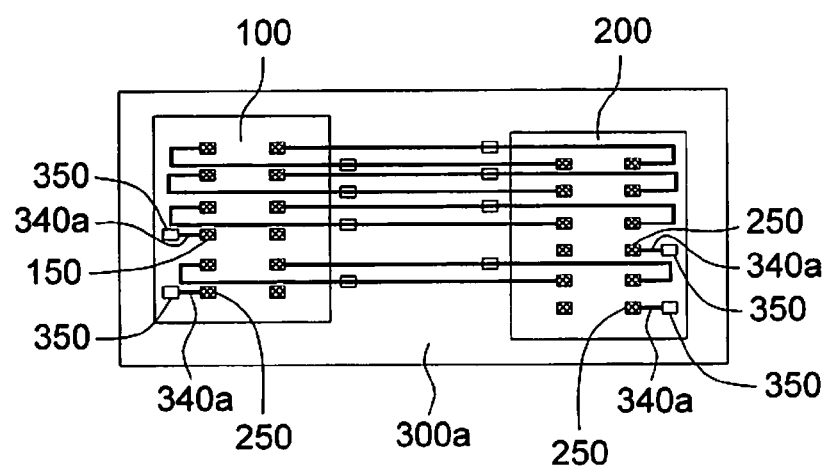
FIG. 5 shows a top view of a package structure according to a second embodiment of the invention.

Referring to FIG. 5, a top view of a package structure 2000 according to a second embodiment of the invention is shown. The package structure 2000 of the present embodiment of the invention differs with the package structure 1000 of the first embodiment in the disposition of the power wire 340a, and other similarities are not repeated.

As indicated in FIG. 5, the semiconductor interposer 300a of the present embodiment of the invention includes a plurality of power wires 340a, and one end of each power wire 340a is connected to and disposed near a power conductive bump 150 or a power conductive bump 250. The other end of each power wire 340a is connected to its respective power conductive column 350. Thus, the length of each power wire 340a can be reduced to a minimum, so that the impedance of the power wire 340a can also be reduced to a minimum.

Third Embodiment

Figure 6:
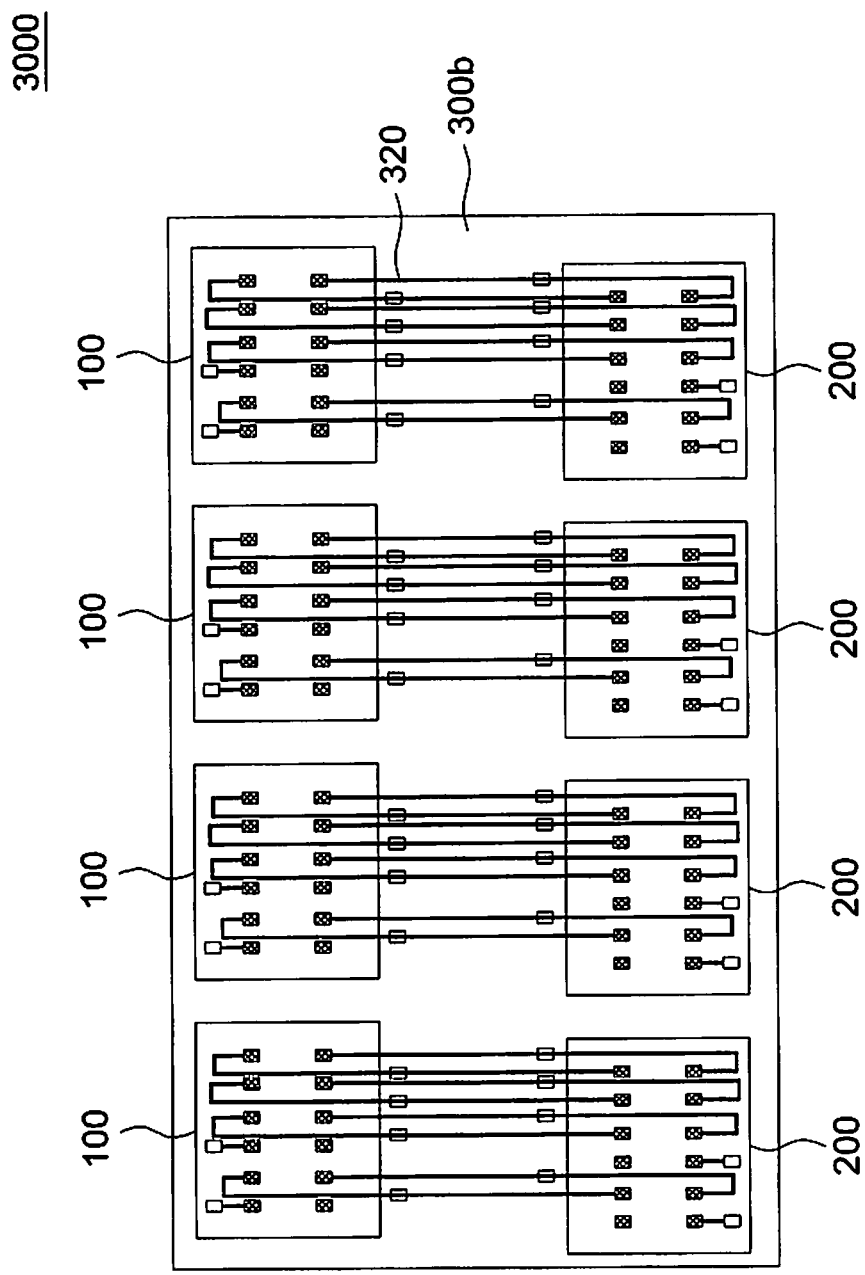
FIG. 6 shows a top view of a package structure according to a third embodiment of the invention.

Referring to FIG. 6, a top view of a package structure 3000 according to a third embodiment of the invention is shown. The package structure 3000 of the present embodiment of the invention differs with the package structure 2000 of the second embodiment in the quantity of the first semiconductor element 100 and the quantity of the second semiconductor element 200, and other similarities are not repeated here.

As indicated in FIG. 6, the package structure 3000 includes a plurality of first semiconductor elements 100 and a plurality of second semiconductor elements 200. The first semiconductor elements 100 and the second semiconductor elements 200 have the same quantity. The first semiconductor elements 100 correspond to the second semiconductor elements 200 one by one.

When the first semiconductor element 100 and the second semiconductor element 200 are similar, the semiconductor interposer 300b can produce multiple patterns of the signal wires 320 and the power wire 340a by exposing a photo mask repeatedly, which is indeed very convenient.

Fourth Embodiment

Figure 7:
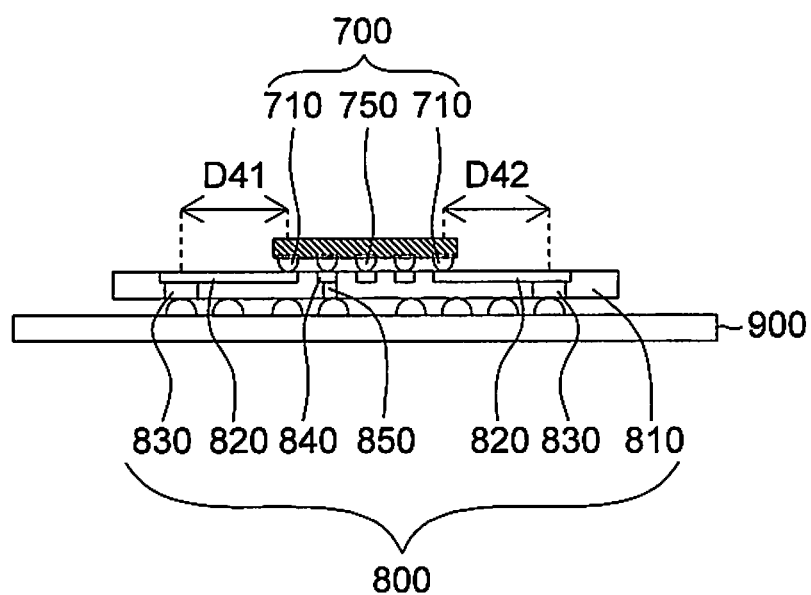
FIG. 7 shows a top view of a package structure according to a fourth embodiment of the invention.
Figure 8:
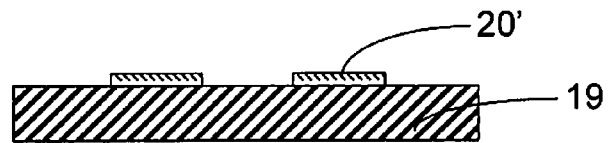
FIG. 8-13 shows a method of manufacturing a semiconductor interposer.

Referring to FIG. 7, a top view of a package structure 4000 according to a third embodiment of the invention is shown. The package structure 4000 of the present embodiment of the invention differs with the package structure 1000 of the first embodiment in the quantity of the semiconductor element 700 and the disposition of the signal wires 820 and power wire 840, and other similarities are not repeated here.

As indicated in FIG. 7, the package structure 4000 of the present embodiment of the invention includes a semiconductor element 700, a semiconductor interposer 800 and a substrate 900. In the present embodiment of the invention, the package structure 4000 only includes a semiconductor element 700, the semiconductor element 700 includes at least two signal conductive bumps 710 and a power conductive bump 750, and the semiconductor interposer 800 includes a connection motherboard 810, at least two signal conductive columns 830, at least two signal wires 820, at least one power wire 840 and at least one power conductive column 850. The signal conductive columns 830 pass through the connection motherboard 810. The signal wires 820 are disposed on the connection motherboard 810, and the two ends of each signal wire 820 are electrically connected to one of the signal conductive bumps 710 and one of the signal conductive columns 830 respectively. The substrate 900 is electrically connected to the signal conductive columns 830.

The lengths (such as the lengths D41 and D42 of FIG. 7) of the signal wires 820 are substantially the same. Therefore, when the signal conductive bumps 710 transmit signals, difference in arrival time is reduced.

Besides, one end of the power wire 840 is connected to and disposed near the power conductive bump 750. Thus, the impedance of the power wire 840 can be reduced to a minimum and the transmission efficiency of the power signal is enhanced.

Also, the semiconductor interposer adopted in the above embodiments of the invention can be a paper lead frame. To further elaborate the structure and manufacturing method of the paper lead frame, an embodiment is disclosed below with accompanying drawings.

Referring to FIGS. 8-13, a method of manufacturing a semiconductor interposer is shown. Firstly, a carrier 19 is provided and a patterned first conductive layer 20' is formed on the carrier 19. In the present embodiment of the invention, the carrier is exemplified by a copper plate.

Figure 9:
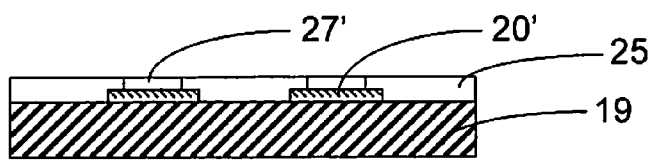

Referring to FIG. 9, a photo-resist layer 25 is formed above the first conductive layer 20'. The photo-resist layer 25 is patterned and forms an opening 27'.

Figure 10:
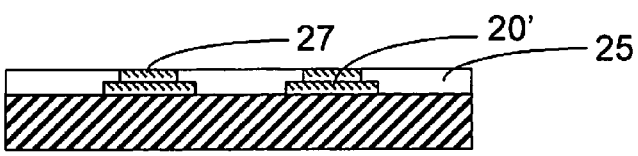

Referring to FIG. 10, a second conductive layer 27 is formed in the opening 27'. In the present embodiment of the invention, the second conductive layer 27, formed by electroplating, is flat and is not protruded from the surface of the photo-resist layer 25.

Figure 11:
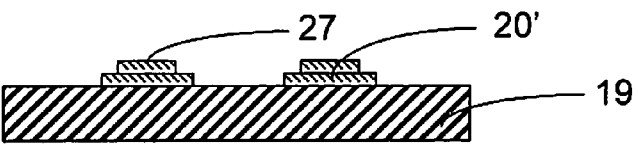

Referring to FIG. 11, the photo-resist layer 25 is removed to obtain the patterned first conductive layer 20' and the patterned second conductive layer 27.

Figure 12:
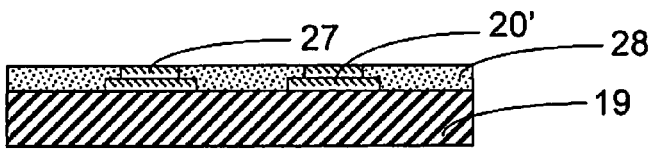

Referring to FIG. 12, a molding material is infused into a mold to form a first insulation layer 28, so that the patterned first conductive layer 20' and the second conductive layer 27 are embedded into the first insulation layer 28. In the present embodiment of the invention, the molding material used in the first insulation layer 28 is epoxy resin possessing the characteristics of elastic modulus being larger than 1·0 GPa and CTE value being smaller than l0 ppm.

Figure 13:
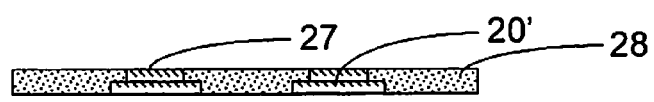

Referring to FIG. 13, the carrier 19 is removed by etching to obtain a pre-packaged semiconductor interposer.

Through the design of a semiconductor interposer, the package structure of the above embodiment of the invention, have many advantages exemplified below:

Firstly, the first conductive bump, the signal wire, the signal conductive column and the conductive tin balls form a signal transmission path, and the second conductive bump, the signal wire, the signal conductive column and the conductive tin balls also form a signal transmission path. Thus, the substrate can simultaneously form a signal communication path with the first semiconductor element and with the second semiconductor element.

Secondly, as the signal conductive column is connected to the middle point of the signal wire, the lengths of the two transmission path are substantially the same, so the difference in arrival time between the two transmission paths is reduced.

Thirdly, the U-shaped bending structure prolongs the distances between the middle point of the signal wire and the two ends of the signal wire, therefore a part of the signal conductive columns are arranged along a fifth extension line, a part of the signal conductive columns are arranged along a sixth extension line, the interval between the fifth extension line and the sixth extension line is larger than the interval between the first extension line and the third extension line as well as the interval between the second extension line and the fourth extension line.

Fourthly, the semiconductor interposer enables the first semiconductor element and the second semiconductor element to form its respective signal transmission path with the substrate by using a single-layered circuit structure only without using a complicated multi-layered circuit structure, hence largely reducing the manufacturing cost and the material cost.

Fifthly, if the power conductive bump is serially connected to one power wire which is disposed near the power conductive bump, the quantity of the power wire is decreased and the length of the power wire is reduced. Thus, the impedance of the power wire is reduced to a minimum, and the transmission efficiency of the power signal is enhanced.

Sixthly, the first sealant and the second sealant provide thorough protection to the package structure.

Seventhly, if one end of each power wire is connected to a power conductive bump and disposed near the power conductive bump, the length of each power wire can be reduced to a minimum, and the impedance of power wire can also be reduced to a minimum.

Eighthly, the semiconductor interposer is not only applicable to the electrical connection between two semiconductor elements but is also applicable to the electrical connection among many semiconductor elements. Meanwhile, the semiconductor interposer can produce multiple patterns of the signal wires and the power wire by exposing a photo mask repeatedly.

Ninthly, despite the semiconductor interposer electrically connects two semiconductor elements as one set in the above embodiments, the semiconductor interposer can also electrically connect a plurality of semiconductor elements as one set as is pursuant to the needs of the design.

Tenthly, through the signal transmission of the semiconductor interposer, the minimum interval of the conductive bump of the semiconductor element is further reduced. Let the first embodiment be taken for example. The minimum interval between the first conductive bump and the third conductive bump can be smaller than 100 μm, and the minimum interval between the second conductive bump and the fourth conductive bump can also be smaller than 100 μm.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:
1. A package structure comprising:
   at least one first semiconductor element having a plurality of first conductive bumps;
   at least one second semiconductor element having a plurality of second conductive bumps; and
   a semiconductor interposer comprising:
      a connection motherboard having a first surface and a second surface opposite the first surface and composed of at least one insulating layer;
      a first conductive layer disposed in the connection motherboard and including a plurality of wires; and a second conductive layer disposed in the connection motherboard and including a plurality of conductive columns;

wherein the first conductive layer and the second conductive layer are electrically connected in the connection motherboard, at least one wire is exposed on the first surface and at least one conductive column is exposed on the second surface for electrically connecting the first surface to the second surface;

wherein at least one wire is electrically connected to one of the plurality of first conductive bumps and one of the plurality of second conductive bumps and at least one conductive column is electrically connected to the at least one wire.

2. The package structure according to claim 1, wherein the first semiconductor element and the second semiconductor element are memory chips.

3. The package structure according to claim 1, wherein the first semiconductor element and the second semiconductor element have the same circuit structure.

4. The package structure according to claim 1, wherein the at least one conductive column is electrically connected to a middle point of the at least one wire, and the distances from the middle point to the first and the second conductive bump are substantially the same.

5. The package structure according to claim 1, wherein the wire has a U-shaped bending structure.

6. The package structure according to claim 1, wherein the wire comprises:

a first sub wire whose one end is connected to one of first conductive bumps;

a second sub wire whose one end is connected to one of second conductive bumps and parallel to the first sub wire; and a third sub wire whose two ends are connected to the other end of the first sub wire and the other end of the second sub wire respectively.

7. The package structure according to claim 6, wherein the third sub wire is substantially perpendicular to the first sub wire and the second sub wire.

8. The package structure according to claim 1, wherein the first conductive bumps are arranged along a first extension line on the first semiconductor element, the second conductive bumps are arranged along a second extension line on the second semiconductor element, the first extension line and the second extension line are substantially parallel to each other.

9. The package structure according to claim 8, wherein the first semiconductor element further comprises a plurality of third conductive bumps, the second semiconductor element further comprises a plurality of fourth conductive bumps, the third conductive bumps are arranged along a third extension line on the first semiconductor element, the fourth conductive bumps are arranged along a fourth extension line on the second semiconductor element, the first extension line, the second extension line, the third extension line and the fourth extension line are substantially parallel to one another.

10. The package structure according to claim 9, wherein the semiconductor interposer comprises a plurality of conductive columns arranged along a fifth extension line and a sixth extension line on the semiconductor interposer, the interval between the fifth extension line and the sixth extension line is larger than the interval between the first extension line and the third extension line as well as the interval between the second extension line and the fourth extension line.

11. The package structure according to claim 9, wherein the interval between the first extension line and the third extension line is substantially equal to the interval between the second extension line and the fourth extension line.

12. The package structure according to claim 9, wherein the minimum interval between the plurality of conductive bumps on the first and second semiconductor elements is smaller than 150 μm.

13. The package structure according to claim 1, wherein the wire and the conductive columns are formed from electroplated copper.

14. The package structure according to claim 1, further comprising a substrate electrically connected to the at least one conductive column on the second surface.

15. The package structure according to claim 1, wherein the package structure comprises a plurality of first semiconductor elements and a plurality of second semiconductor elements, wherein the plurality of first semiconductor elements and the plurality of second semiconductor elements have the same quantity.

16. The package structure according to claim 1, wherein the insulating layer formed of an epoxy molding material.

17. The package structure according to claim 1, wherein the insulating layer is formed of a thermo plastic molding material.

18. The package structure according to claim 1, further comprising:

a first sealant disposed between the first semiconductor element and the semiconductor interposer and between the second semiconductor element and the semiconductor interposer.

19. The package structure according to claim 14, further comprising:

a second sealant disposed between the semiconductor interposer and a substrate.

20. The package structure according to claim 1, wherein the connection motherboard is composed of one insulating layer and the plurality of conductive columns is disposed on the plurality of wires such that the semiconductor interposer is a single-layered circuit structure.

21. The package structure according to claim 1, wherein the connection motherboard of the semiconductor interposer is formed by infusing a molding material into a mold to form the at least one insulating layer such that the plurality of wires and conductive columns are embedded into the connection motherboard.

22. A package structure comprising:

a semiconductor element having at least two conductive bumps; and a semiconductor interposer for receiving the semiconductor element, wherein the semiconductor interposer comprises:

a connection motherboard having a first surface and a second surface opposite the first surface and composed of at least one insulating layer;

a first conductive layer disposed in the connection motherboard and including a plurality of wires; and a second conductive layer disposed in the connection motherboard and including a plurality of conductive columns;

wherein the first conductive layer and the second conductive layer are electrically connected in the connection motherboard, at least two wires are exposed on the first surface and at least two conductive columns are exposed on the second surface for electrically connecting the first surface to the second surface;

wherein each of at least two wires is electrically connected to one of the at least two conductive bumps and one of the at least two conductive columns, and the lengths of the wires are substantially the same.

23. The package structure according to claim 22, wherein the minimum interval between the conductive bumps on the semiconductor element is smaller than 150 μm.

24. The package structure according to claim 22, wherein the signal wires and the conductive columns are formed from electroplated copper.

25. The package structure according to claim 22, further comprising a substrate electrically connected to the at least two conductive columns on the second surface.

26. The package structure according to claim 22, wherein the insulating layer is formed of an epoxy molding material.

27. The package structure according to claim 25, wherein the insulating layer is formed of a thermoplastic molding material.

28. The package structure according to claim 22, further comprising:
   a first sealant disposed between the semiconductor element and the semiconductor interposer.

29. The package structure according to claim 25, further comprising:
   a second sealant disposed between the semiconductor interposer and the substrate.

30. The package structure according to claim 22, wherein the connection motherboard is composed of one insulating layer and the plurality of conductive columns is disposed on the plurality of wires such that the semiconductor interposer is a single-layered circuit structure.

\* \* \* \* \*